(12) United States Patent
Ishikawa et al.

(10) Patent No.: US 7,447,485 B2
(45) Date of Patent: Nov. 4, 2008

(54) DEVICE AND METHOD FOR CONTROLLING A VOLTAGE CONTROL SIGNAL

(75) Inventors: Hiroyoshi Ishikawa, Kawasaki (JP);
Kazuo Nagatani, Kawasaki (JP);
Hajime Hamada, Kawasaki (JP);
Nobukazu Fudaba, Kawasaki (JP);
Tokuro Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 408 days.

(21) Appl. No.: 11/367,379

(22) Filed: Mar. 6, 2006

(65) Prior Publication Data

US 2007/0146068 A1 Jun. 28, 2007

(30) Foreign Application Priority Data

Dec. 22, 2005 (JP) .............................. 2005-370647

(51) Int. Cl.
*H01Q 11/12* (2006.01)
*H04B 1/04* (2006.01)

(52) U.S. Cl. .................... 455/127.1; 455/126; 330/127; 330/297; 375/297

(58) Field of Classification Search .............. 455/115.1, 455/115.3, 115.4, 126, 127.1, 127.2, 572; 330/75, 127, 136, 297; 375/297

See application file for complete search history.

(56) References Cited

U.S. PATENT DOCUMENTS

| 6,438,360 | B1 * | 8/2002 | Alberth et al. ............... 455/110 |
| 6,646,501 | B1 * | 11/2003 | Wessel ........................ 330/10 |
| 7,193,470 | B2 * | 3/2007 | Lee et al. ..................... 330/285 |
| 2003/0146791 | A1 * | 8/2003 | Shvarts et al. ................ 330/297 |
| 2005/0083121 | A1 * | 4/2005 | Tsai et al. .................... 330/136 |
| 2005/0110562 | A1 * | 5/2005 | Robinson et al. .............. 330/10 |

FOREIGN PATENT DOCUMENTS

| EP | 1317105 A | 6/2003 |
| JP | 3-174810 | 7/1991 |

* cited by examiner

*Primary Examiner*—Quochien B Vuong
(74) *Attorney, Agent, or Firm*—Hanify & King, P.C.

(57) ABSTRACT

A device is disclosed that includes an amplification part for a linear transmitter, the amplification part being configured to amplify a transmission signal in accordance with a supply voltage control signal; a generation part configured to generate a power supply signal showing the level of the transmission signal; and a control part configured to output the supply voltage control signal based on the power supply signal. The control part includes a storage part configured to store a series of values of the power supply signal belonging to a time range including a certain point of time; and an output part configured to output a maximum one of a predetermined number of values of the series of values of the power supply signal as the supply voltage control signal at the certain point of time.

11 Claims, 14 Drawing Sheets

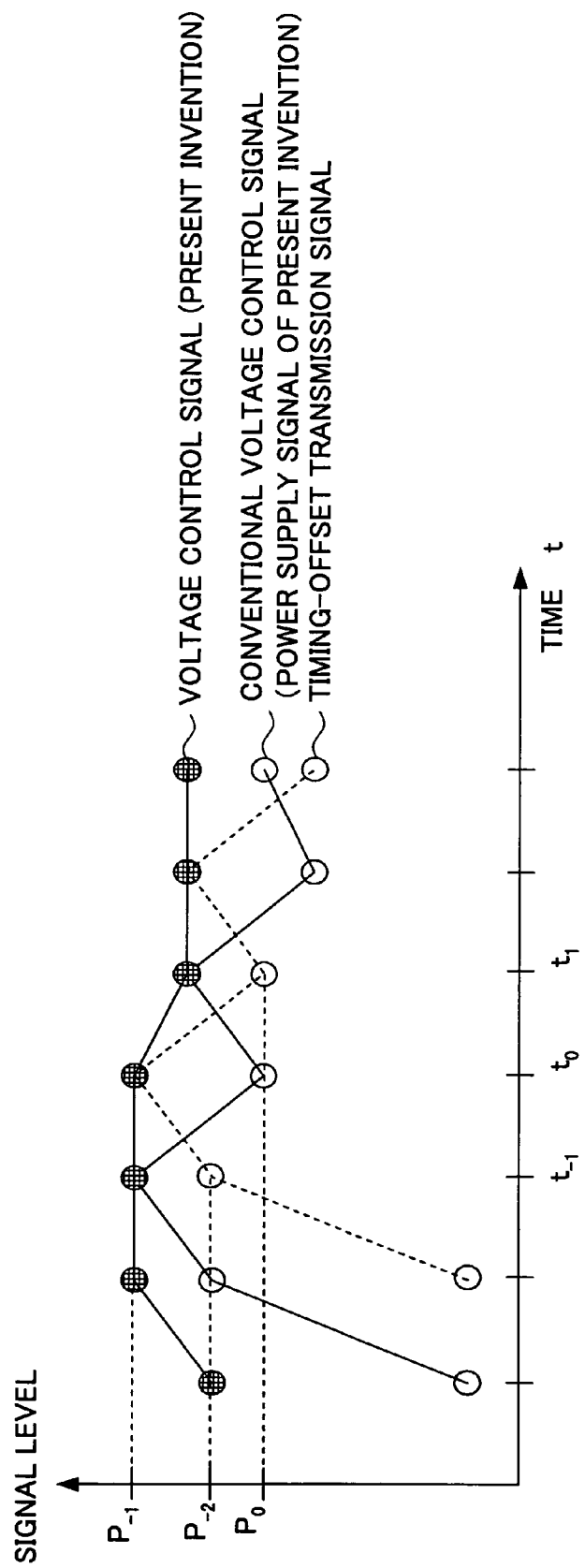

DEVICE AND METHOD FOR CONTROLLING A VOLTAGE CONTROL SIGNAL

BACKGROUND OF THE INVENTION

1. Field of the Invention

The present invention relates generally to the technical field of amplifiers employed in high frequency bands, and more particularly to a device and method for correcting the voltage control signals of the amplifiers.

2. Description of the Related Art

In a linear transmitter, a signal to be transmitted is linearly amplified and transmitted. In order to linearly amplify signals of various (power) levels ranging from low to high, it is necessary to supply power to the amplifier based on a high level signal. However, constant application of high supply voltage to the amplifier has the problem of significant reduction in amplification efficiency in the case of amplifying a small (low power) signal. This is disadvantageous in particular to simple mobile communications devices and devices using a small-size battery. In order to cope with such a problem, the technique of suitably switching supply voltage to be applied to an amplifier in accordance with the level of a signal to be amplified is proposed (see, for example, Japanese Laid-Open Patent Application No. 3-174810).

FIG. 1 is a diagram for illustrating such amplification control. A transmission signal is input to an amplifier 101. The amplifier 101 amplifies the input signal in accordance with a voltage control signal v, and outputs an amplified output signal. The voltage control signal v varies in accordance with the amplitude level of the transmission signal, and is derived from an envelope detector 102. A signal indicating the level of amplitude may be referred to as "envelope signal."

FIG. 2 is a graph showing exemplary input/output characteristics of an amplifier. The horizontal axis represents the voltage level of an input signal, and the vertical axis represents the voltage level of an output signal. In FIG. 2, three sets of input/output characteristics are indicated by respective lines a, b, and c. The line a shows the case where the input/output characteristic shows linearity at or below an input voltage a1 and is non-linear above the input voltage a1. The line b shows the case where the input/output characteristic shows linearity at or below an input voltage a2 and is non-linear above the input voltage a2. The line c shows the case where the input/output characteristic shows linearity at or below an input voltage a3 and is non-linear above the input voltage a3.

The envelope detector 102 of FIG. 1 measures the level of the transmission signal. If the measured level is low, the envelope detector 102 sets the voltage control signal v for the amplifier 101 to v1 (v=v1). As a result, the amplifier 101 shows an input/output characteristic as indicated by a in FIG. 2, and small signals having a level lower than or equal to v1 are linearly amplified. On the other hand, if the measured level of the transmission signal is high, the envelope detector 102 sets the voltage control signal v for the amplifier 101 to v3 (v=v3). As a result, the amplifier 101 shows an input/output characteristic as indicated by c in FIG. 2, and large signals are also linearly amplified. Thus, by suitably changing the supply voltage of the amplifier 101 in accordance with the input signal, it is possible to obtain a linearly amplified output signal with high efficiency. Practically, voltages of more than these three levels v1, v2, and v3 are applied continuously or step by step to the amplifier 101.

According to the above-described method, supply voltage is suitably changed in accordance with the level of the input signal. Accordingly, the input signal and the voltage control signal v should be timed appropriately with each other. On the other hand, the properties of devices (the properties of analog devices in particular) vary to some extent because of the material characteristics of the devices, manufacturing processes, and manufacturing environment. As a result, there is concern that the transmission signal (input signal) and the voltage control signal v are slightly out of phase with each other.

FIG. 3 shows the input signal, output signal, and voltage control signal of an amplifier. The horizontal axis represents time, and the vertical axis represents an amplitude level. FIG. 3 shows the case where the input signal and the voltage control signal, which should be in phase with each other, are out of phase with each other by a time $\tau$, so that the waveform of the output signal is different from what it should be. For example, in the period indicated by $T_1$, the fed voltage control signal is greater than the input signal. In this case, the input signal itself may be linearly amplified. However, since a voltage higher than the necessary supply voltage is applied to the amplifier, the efficiency of amplification is reduced. In the period indicated by $T_2$, a signal of a level exceeding the highest voltage that can be linearly amplified by the amplifier is input to the amplifier. Accordingly, the output signal of the amplifier deviates from the linear amplification of the input signal, and is non-linearly amplified. Thus, if the input signal and the voltage control signal are not appropriately timed with each other, the degradation of a signal and the radiation of unnecessary waves are caused. This problem of timing offset occurs product by product. Accordingly, its compensation should also be performed product by product. However, a method for automatically performing such compensation or control with efficiency has not been discovered, while performing it manually is time-consuming and unsuitable for controlling many products.

SUMMARY OF THE INVENTION

According to one aspect of the present invention, a device and a method for correcting a voltage control signal in which the above-described disadvantage is eliminated are provided.

According to another aspect of the present invention, there are provided a device and a method used in a linear transmitter in which the supply voltage level of an amplifier is switched in accordance with the level of a transmission signal for correcting a voltage control signal so that an output signal with less distortion is output with high amplification efficiency.

According to one embodiment of the present invention, there is provided a device including an amplification part for a linear transmitter, the amplification part being configured to amplify a transmission signal in accordance with a supply voltage control signal; a generation part configured to generate a power supply signal showing a level of the transmission signal; and a control part configured to output the supply voltage control signal based on the power supply signal, wherein the control part includes: a storage part configured to store a series of values of the power supply signal belonging to a time range including a certain point of time; and an output part configured to output a maximum one of a predetermined number of values of said series of values of the power supply signal as the supply voltage control signal at the certain point of time.

According to one embodiment of the present invention, there is provided a method including the steps of: (a) generating a power supply signal showing a level of a transmission signal to be transmitted from a linear transmitter; (b) outputting a supply voltage control signal based on the power supply signal; and (c) amplifying the transmission signal in accordance with the supply voltage control signal, wherein step (b) includes the steps of: (d) storing a series of values of the power supply signal belonging to a time range including a certain point of time; and (e) outputting a maximum one of a predetermined number of values of the series of values of the power supply signal as the supply voltage control signal at the certain point of time.

According to one aspect of the present invention, in a transmitter switching the power supply level of an amplifier for a linear transmitter in accordance with the level of a transmission signal, a supply voltage control signal is created so that an output signal including little distortion can be output with high amplification efficiency even if there is timing offset between the transmission signal input to the amplifier and a power supply signal.

BRIEF DESCRIPTION OF THE DRAWINGS

Other objects, features and advantages of the present invention will become more apparent from the following detailed description when read in conjunction with the accompanying drawings, in which:

FIG. 6C is a graph showing the voltage control signal, a power supply signal, and a timing-offset transmission signal according to the first embodiment of the present invention;

DETAILED DESCRIPTION OF THE PREFERRED EMBODIMENTS

A description is given below, with reference to the accompanying drawings, of embodiments of the present invention.

First Embodiment

Figure 4:
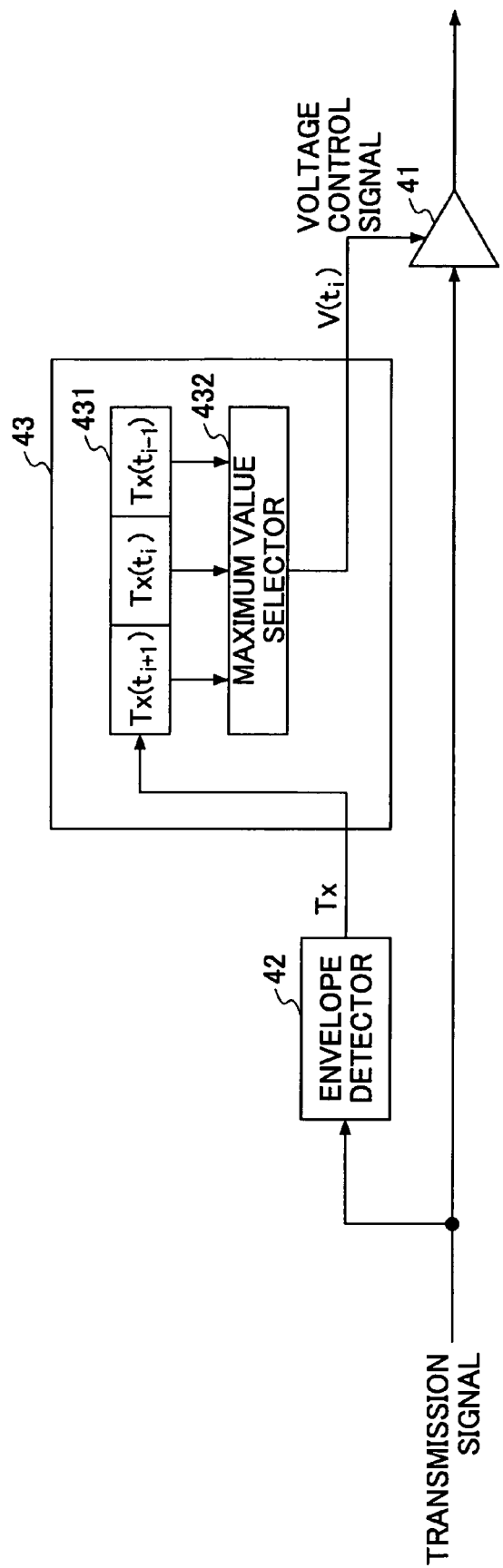
FIG. 4 is a block diagram showing part of a linear transmitter according to a first embodiment of the present invention.

FIG. 4 is a block diagram showing part of a linear transmitter according to a first embodiment of the present invention. Referring to FIG. 4, the linear transmitter of this embodiment includes an amplifier 41, an envelope detector part 42, and a voltage control signal controller part 43. The voltage control signal controller part 43 includes a shift register 431 and a maximum value selector part 432. In FIG. 4, the other elements of the linear transmitter are not shown for simplification of description.

The amplifier 41 is a power amplifier that amplifies and outputs a transmission signal (a signal to be transmitted) under supply voltage indicated by a voltage control signal V.

The envelope detector part 42 calculates or measures the amplitude level of a transmission signal input thereto. If the signal has been subjected to quadrature modulation, the envelope detector part 42 calculates the magnitude of the signal by determining the root sum square of its inphase component and quadrature component. A signal indicating the level of amplitude is also referred to as "envelope signal." The envelope detector part 42 derives or determines, in accordance with the amplitude level of the signal input thereto, supply voltage that is optimal for the amplifier 41 when the signal is input to the amplifier 41. Then, the envelope detector part 42 generates and outputs a signal indicating the optimal supply voltage. In this specification, this signal is referred to as "power supply signal Tx." The signal level of the transmission signal may be directly expressed as the power supply signal Tx at the same rate. Alternatively, the power supply signal Tx may be lower in rate than the transmission signal.

Figure 1:
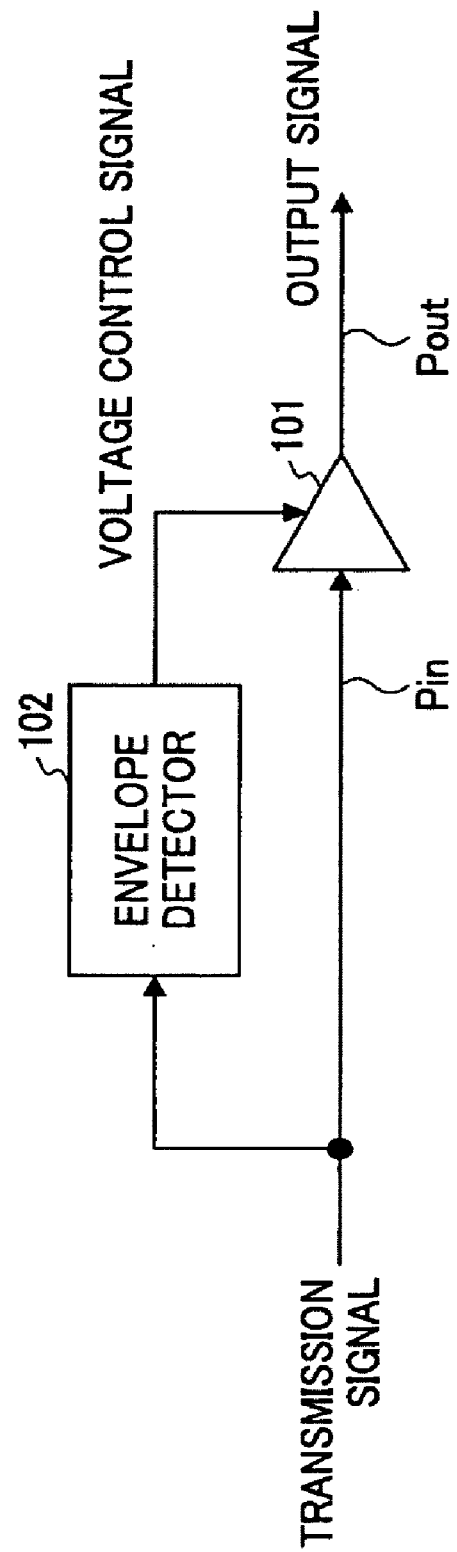
FIG. 1 is a diagram for illustrating a conventional amplification control method.
Figure 2:
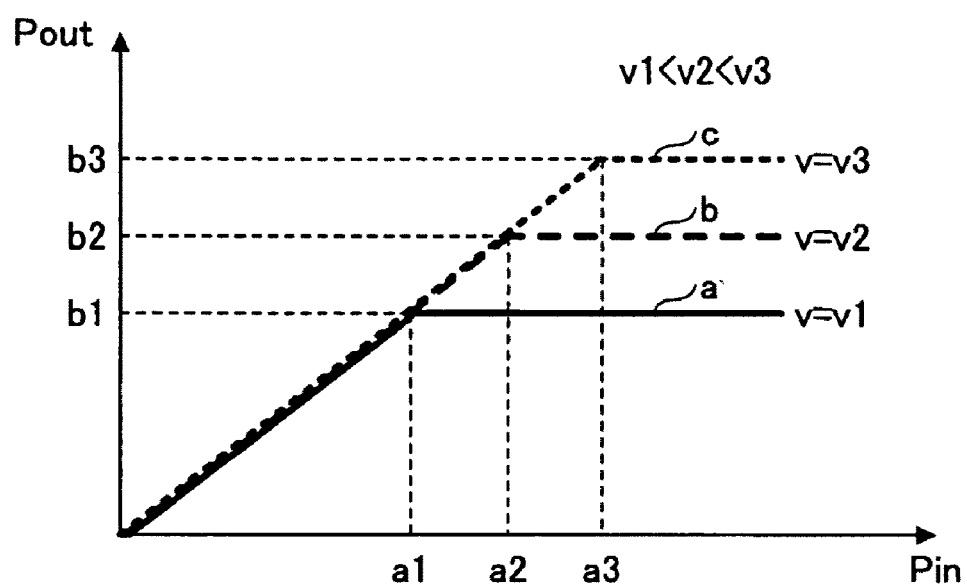
FIG. 2 is a graph showing exemplary input/output characteristics of an amplifier.
Figure 3:
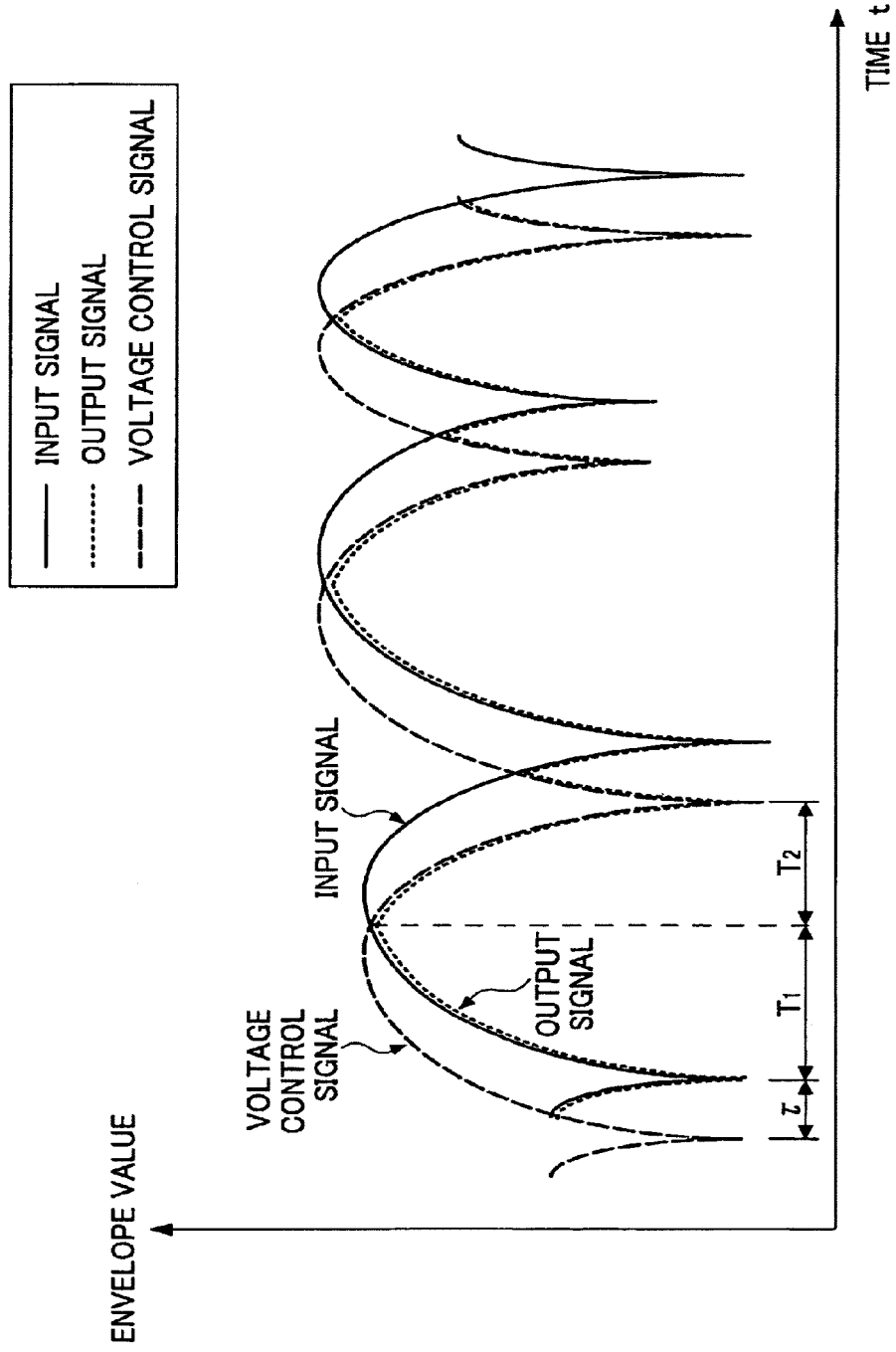
FIG. 3 is a graph showing an input signal, an output signal, and a control signal.

The voltage control signal controller part 43 converts the power supply signal Tx into the voltage control signal V. The power supply signal Tx corresponds to the voltage control signal v in the conventional configuration of FIG. 1. According to this embodiment, the voltage control signal V is created by further modifying the output signal (power supply signal Tx) of the envelope detector part 42. The shift register 431 stores a series of data samples of the power supply signal Tx. According to this embodiment, the shift register 431 stores data samples Tx $(t_{i-1})$, Tx $(t_i)$, and Tx $(t_{i+1})$ sampled at three sampling instants $t_{i-1}, t_i,$ and $t_{i+1}$, respectively. The number of data samples to be stored is not limited to three, and may be other values. The shift register 431 is employed for simplification of description, and may be replaced by a storage element capable of providing a series of data samples to the maximum value selector part 432. The maximum value selector part 432 compares the three data samples Tx $(t_{i-1})$, Tx $(t_i)$, and Tx $(t_{i+1})$, and selects the maximum value among them. This maximum value is output as the value of the voltage control signal V at sampling instant $t_i$.

$$V(t_i)=\text{MAX}\{Tx(t_{i-1}), Tx(t_i), \text{ and } Tx(t_{i+1})\},$$

where MAX{ } is a function to select the maximum value among arguments.

Figure 5:
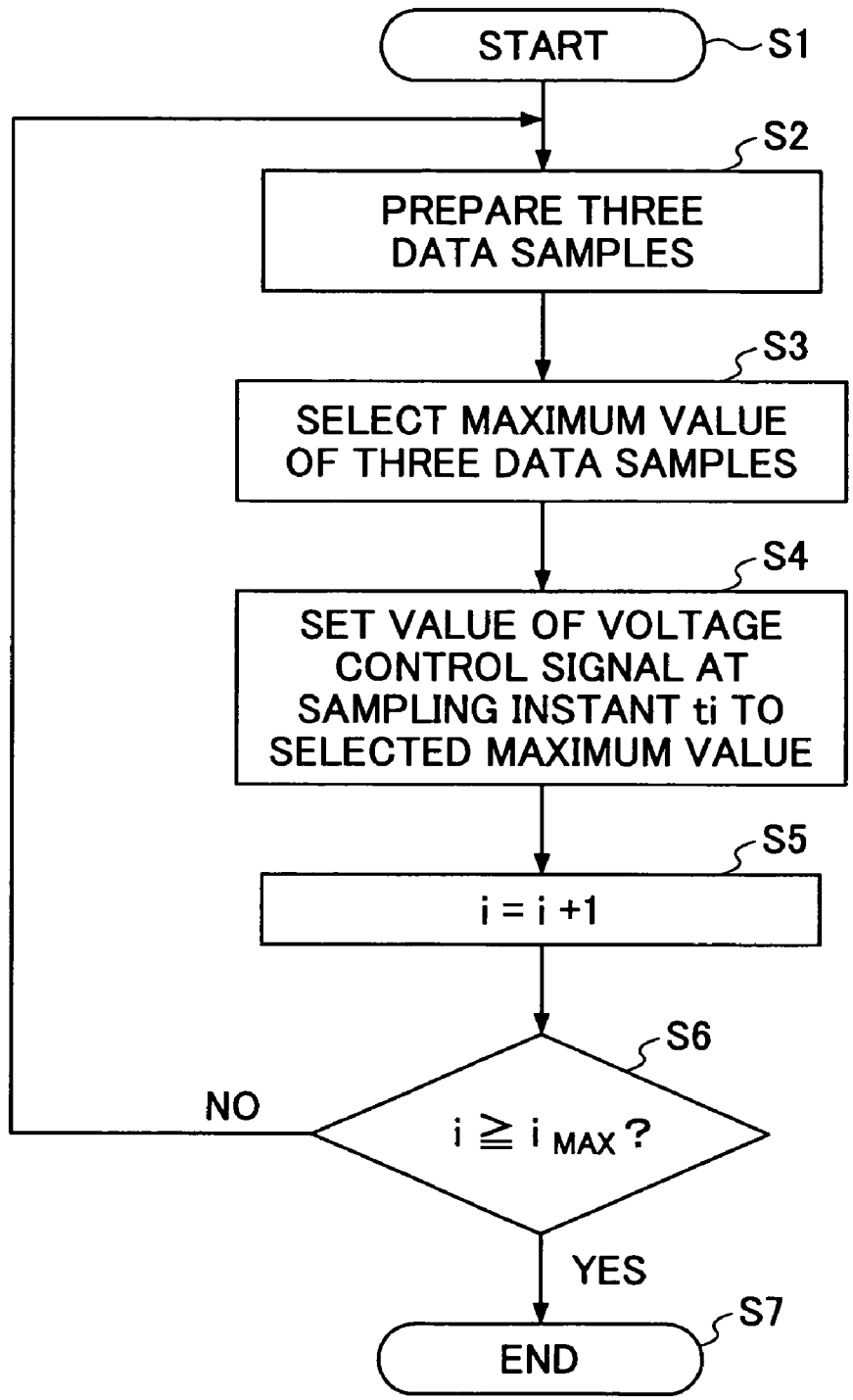
FIG. 5 is a flowchart of a method of controlling a voltage control signal according to the first embodiment of the present invention.

FIG. 5 is a flowchart of a method of controlling the voltage control signal V according to the first embodiment of the present invention. The flow shows a procedure for converting the power supply signal Tx into the voltage control signal V. In step S1, the flow starts, and in step S2, data samples Tx ($t_{i-1}$), Tx ($t_i$), and Tx ($t_{i+1}$) for three sampling instants $t_{i-1}$, $t_i$, and $t_{i+1}$, respectively, are prepared.

In step S3, the values of the three data samples Tx ($t_{i-1}$), Tx ($t_i$), and Tx ($t_{i+1}$) are compared, and the maximum value thereof is selected.

In step S4, the selected maximum value is output as the value of the voltage control signal V at sampling instant $t_i$.

Figure 6A:
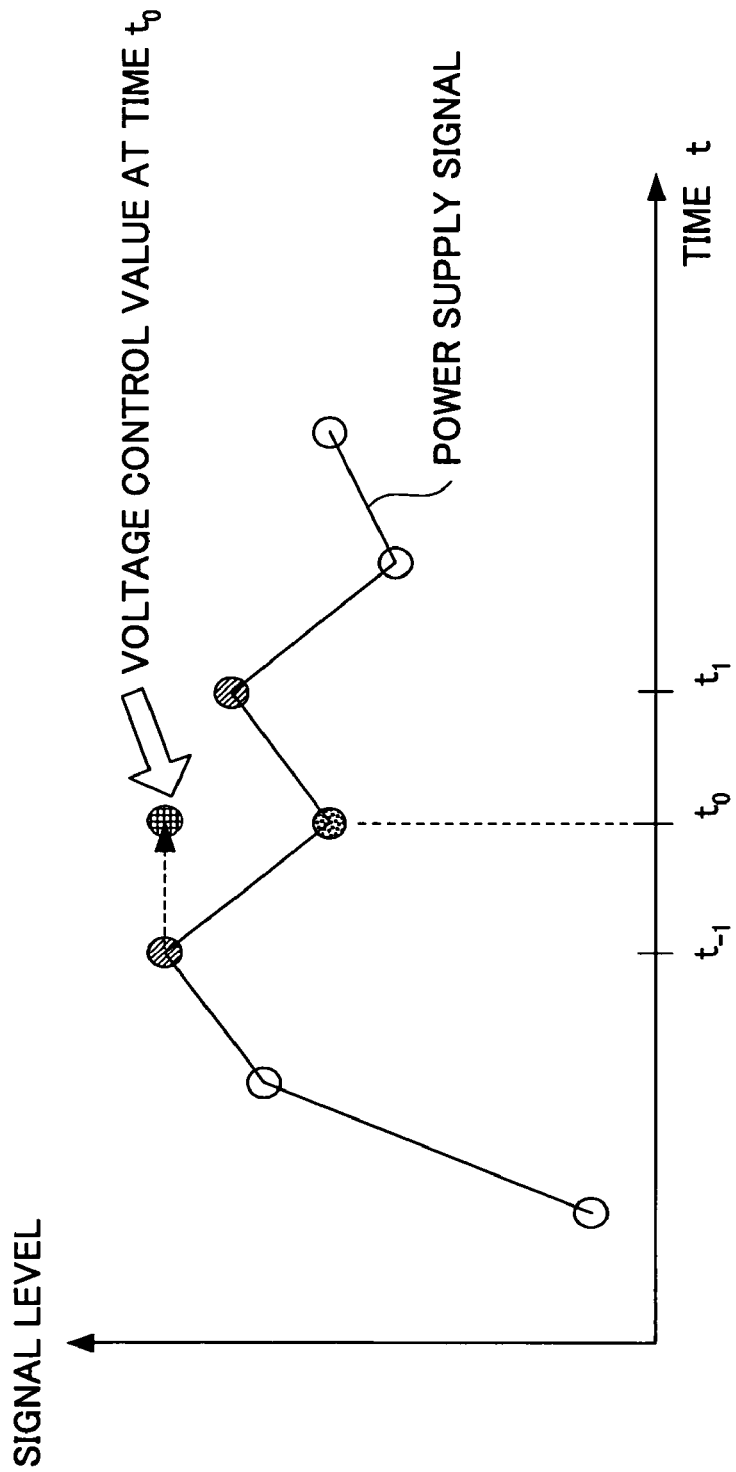
FIG. 6A is a graph showing a method of determining the value of the voltage control signal at $t=t_0$ according to the first embodiment of the present invention.

For example, it is assumed that the power supply signal Tx is obtained as shown in FIG. 6A. In step S2, data samples Tx ($t_{-1}$), Tx ($t_0$), and Tx ($t_1$) for three sampling instants $t_{-1}$, $t_0$, and $t_1$, respectively, are prepared. In step S3, the maximum one of the values of the data samples Tx ($t_{-1}$), Tx ($t_0$), and Tx ($t_1$) is selected. In the graphically illustrated case, Tx ($t_{-1}$) is selected as the maximum value. In step S4, the selected maximum value is output as the voltage control signal V at sampling instant $t_0$. That is, $V(t_0)=Tx(t_{-1})$.

Figure 6B:
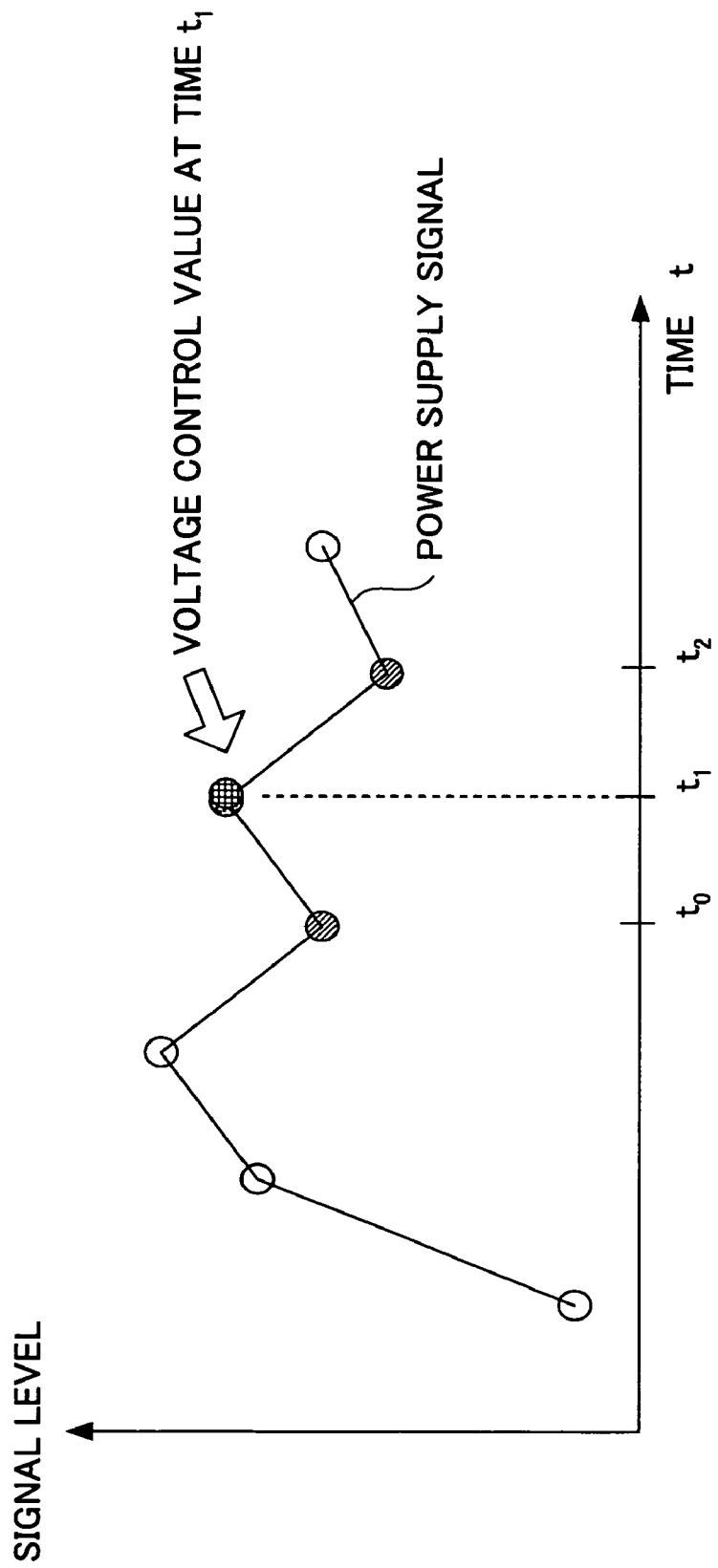
FIG. 6B is a graph showing a method of determining the value of the voltage control signal at $t=t_1$ according to the first embodiment of the present invention.

In step S5 of FIG. 5, the value of the parameter i indicating a sampling instant is incremented. In step S6, it is determined whether the parameter i is greater than or equal to a maximum value $i_{MAX}$. If the parameter i is less than the maximum value $i_{MAX}$ (NO in step S6), the flow returns to step S2, and the same operation as described above is repeated. For example, in the case of i=1 subsequent to i=0, in step S2, the data sample Tx ($t_0$), the data sample Tx ($t_1$), and a data sample Tx ($t_2$) for sampling instants $t_0$, $t_1$, and $t_2$, respectively, are prepared as shown in FIG. 6B. In step S3, the maximum one of the values of the data samples Tx ($t_0$), Tx ($t_1$), and Tx ($t_2$) is selected. In the graphically illustrated case, Tx($t_1$) is selected as the maximum value. In step S4, the selected maximum value is output as the voltage control signal V at sampling instant $t_1$. That is, $V(t_1)=Tx(t_1)$.

Thereafter, the same procedure is repeated, and if the parameter i is greater than or equal to the maximum value $i_{MAX}$ (YES in step S6), this means that the entire power supply signal has been converted into the voltage control signal V, and in step S7, the flow ends.

FIG. 6C is a graph showing the relationship between the voltage control signal V obtained by executing the flow of FIG. 5 and the power supply signal Tx (the conventional voltage control signal v). A transmission signal offset in timing by one sample from the power supply signal Tx is also indicated by the broken line in FIG. 6C. The transmission signal and the power supply signal are identical in waveform except for timing offset. Accordingly, if the transmission signal and the power supply signal coincide in timing with each other, it may be possible to linearly amplify the transmission signal with increased amplification efficiency by amplifying the transmission signal under the supply voltage shown by the power supply signal Tx. However, if the transmission signal and the power supply signal are offset from each other as shown in FIG. 6C, problems such as the above-described radiation of unnecessary waves and signal degradation occur. For example, at sampling instant $t_0$, the power supply signal Tx shows lower voltage than the level of the transmission signal. If the power supply voltage Tx is supplied to the amplifier, the transmission signal is amplified non-linearly. On the other hand, the voltage control signal V according to this embodiment is not below the level of the transmission signal even at sampling instant $t_0$. Accordingly, it is possible to amplify the transmission signal linearly.

According to this embodiment, the voltage control signal V is created so as not to be lower than or equal to the transmission signal in level if the timing offset between the transmission signal and the power supply signal is within the range of plus or minus one ($\pm 1$) sample. In other words, the voltage control signal is created so as to be always higher in level than the transmission signal if the timing offset between the transmission signal and the power supply signal is within the range of $\pm 1$ sample. In the case of employing such a voltage control signal, a voltage higher than a minimum voltage required to amplify the transmission signal at a certain time may be supplied to the amplifier (for example, at sampling instant $t_0$). However, it is expected that in many cases, such a situation does not degrade the efficiency of amplification so much. According to this embodiment, it is possible to ensure reduction in the radiation of unnecessary waves and non-linear distortion in exchange for slight reduction in the efficiency of amplification.

The range of compensatable timing offset between the transmission signal and the power supply signal Tx is limited to the range of $\pm 1$ sample. This is because the data samples of three consecutive sampling instants (one sampling instant and its previous and subsequent sampling instants) are stored in the shift register 431. In order to cope with greater timing offset, more data samples may be stored, and a maximum value may be selected from among them. Accordingly, storing three data samples and compensating for timing offset of $\pm 1$ sample is a mere example, and any appropriate number of data samples may be employed. Further, it is not necessary to employ the same number of data samples before and after a certain sampling instant. For example, if the direction of the offset between the transmission signal and the power supply signal Tx is known, the voltage control signal V may be determined only from the samples of the power supply signal Tx at and after a certain sampling instant, or the voltage control signal V may be generated only from the samples of the power supply signal Tx at and before the certain sampling instant. Further, the number of data samples before a certain sampling instant may be different from the number of data samples after the certain sampling instant. For example, in order to obtain the voltage control signal V at sampling instant $t_0$, the values of the power supply signal Tx at sampling instants $t_{-1}$, $t_1$, $t_2$, and $t_3$ may be employed. However, the data samples prepared for selecting a maximum value should be temporally successive.

Figure 7:
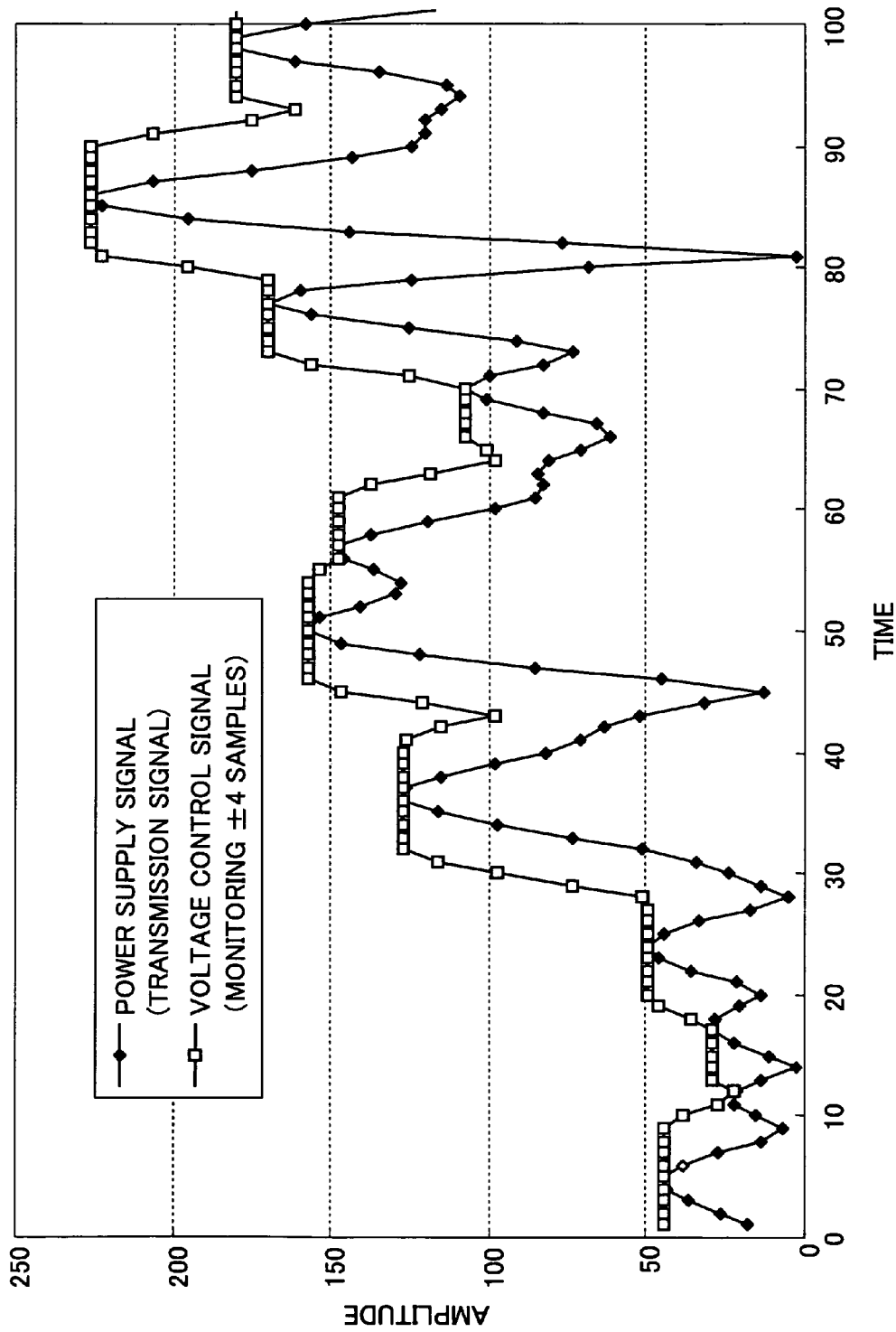
FIG. 7 is a graph showing the voltage control signal and the transmission signal according to the first embodiment of the present invention.

FIG. 7 is a graph showing the relationship between the voltage control signal V and the transmission signal, the voltage control signal V being created by storing data samples over the range of $\pm 4$ sampling instants from a certain sampling instant (nine samples in total), and selecting a maximum value from among the data samples. The horizontal axis represents time (sampling instants), and the vertical axis represents amplitude level. That is, in this case, a series of nine data samples are stored in the shift register 431 at every sampling instant. This makes it possible to control the occurrence of radiation of unnecessary waves and non-linear distortion if the timing offset between the transmission signal and the power supply signal is within the range of $\pm 4$ samples.

Figure 8:
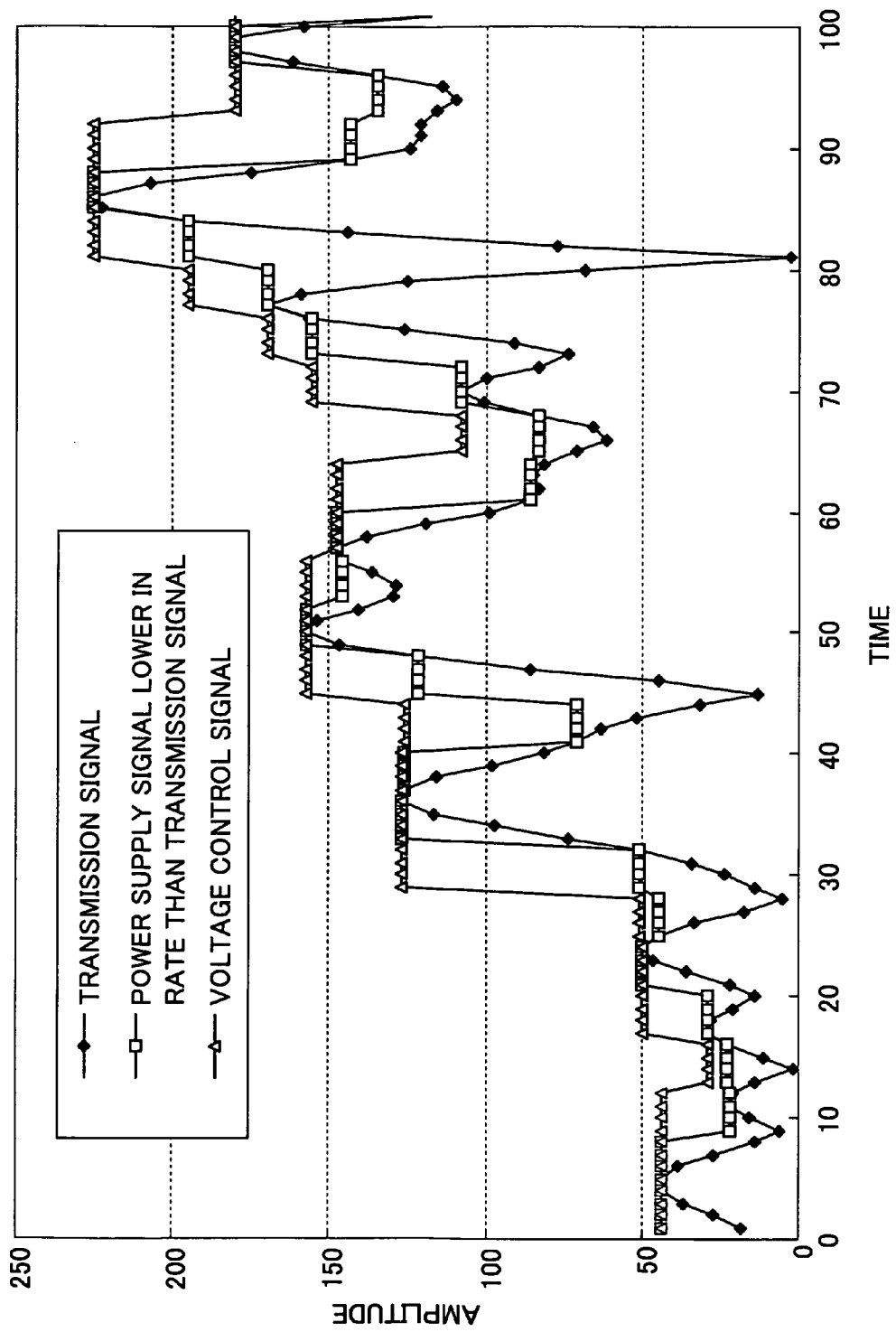
FIG. 8 is a graph showing the voltage control signal, the transmission signal, and the power supply signal lower in rate than the transmission signal according to the first embodiment of the present invention.

FIG. 8 is a graph showing the case where the voltage control signal V is obtained based on the power supply signal Tx lower in rate than the transmission signal. Such a power supply signal may be created in, for example, the envelope detector part 42 shown in FIG. 4. In the graphically illustrated case, the rate of the power supply signal is quarter the rate of the transmission signal. Thus, the contents of the voltage control signal V may be determined by storing multiple samples of the low-rate power supply signal Tx and selecting the maximum one of the values of the samples. In this case also, the voltage control signal V is created so as not to be lower than or equal to the transmission signal in level if the timing offset between the transmission signal and the power supply signal Tx is within the range of ±4 samples, so that it is possible to control radiation of unnecessary waves and signal degradation.

Second Embodiment

According to a second embodiment of the present invention, the number of data samples to be stored in the shift register 431 is adaptively changed. The number of stages of the shift register 431 represents the phase difference between the transmission signal and the power supply signal Tx which phase difference can be compensated for by an embodiment of the present invention. The number of stages may also be referred to as "time range" or "monitoring range." As described above, the shift register 431 may be replaced by a storage element capable of providing a series of data samples to the maximum value selector part 432.

Figure 9:
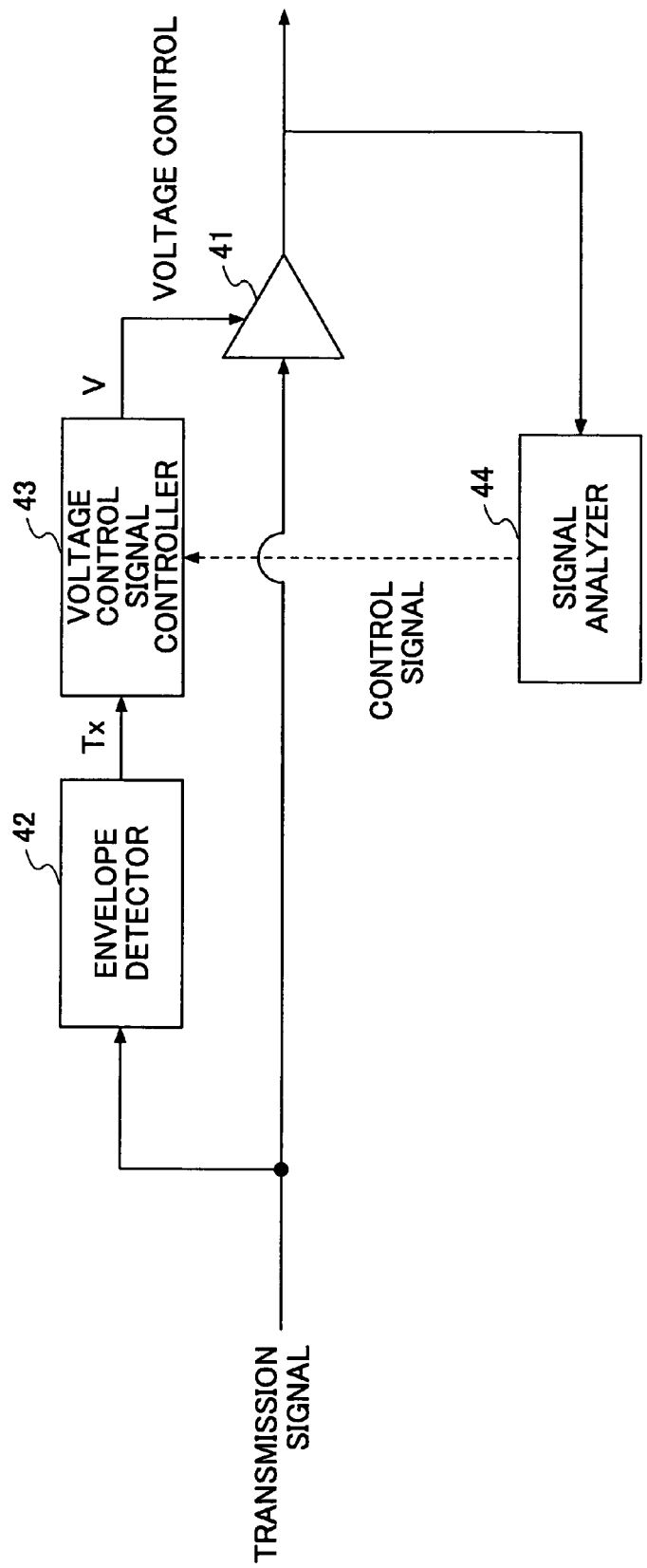
FIG. 9 is a block diagram showing part of a linear transmitter according to a second embodiment of the present invention.

FIG. 9 is a block diagram showing part of a linear transmitter according to the second embodiment of the present invention. In FIG. 9, the same elements as those described above in FIG. 4 are referred to by the same numerals, and a redundant description thereof is omitted. Referring to FIG. 9, a signal analyzer part 44 is provided in addition to the elements described in FIG. 4. The signal analyzer part 44 analyzes the output signal (feedback signal) of the amplifier 41. The analysis may be performed, for example, by measuring unnecessary waves outside a desired band with a spectrum analyzer. Alternatively, the analysis may be performed by measuring the degree of signal degradation by comparing the transmission signal and the feedback signal. That is, the analysis may be performed using a measuring apparatus such as a spectrum analyzer, or be performed using a digital signal processor. The signal analyzer part 44 may be included in the linear transmitter, or be detachably attached to the main body of the linear transmitter through a connector. The latter is preferable in terms of simplifying the configuration of the linear transmitter.

Figure 10:
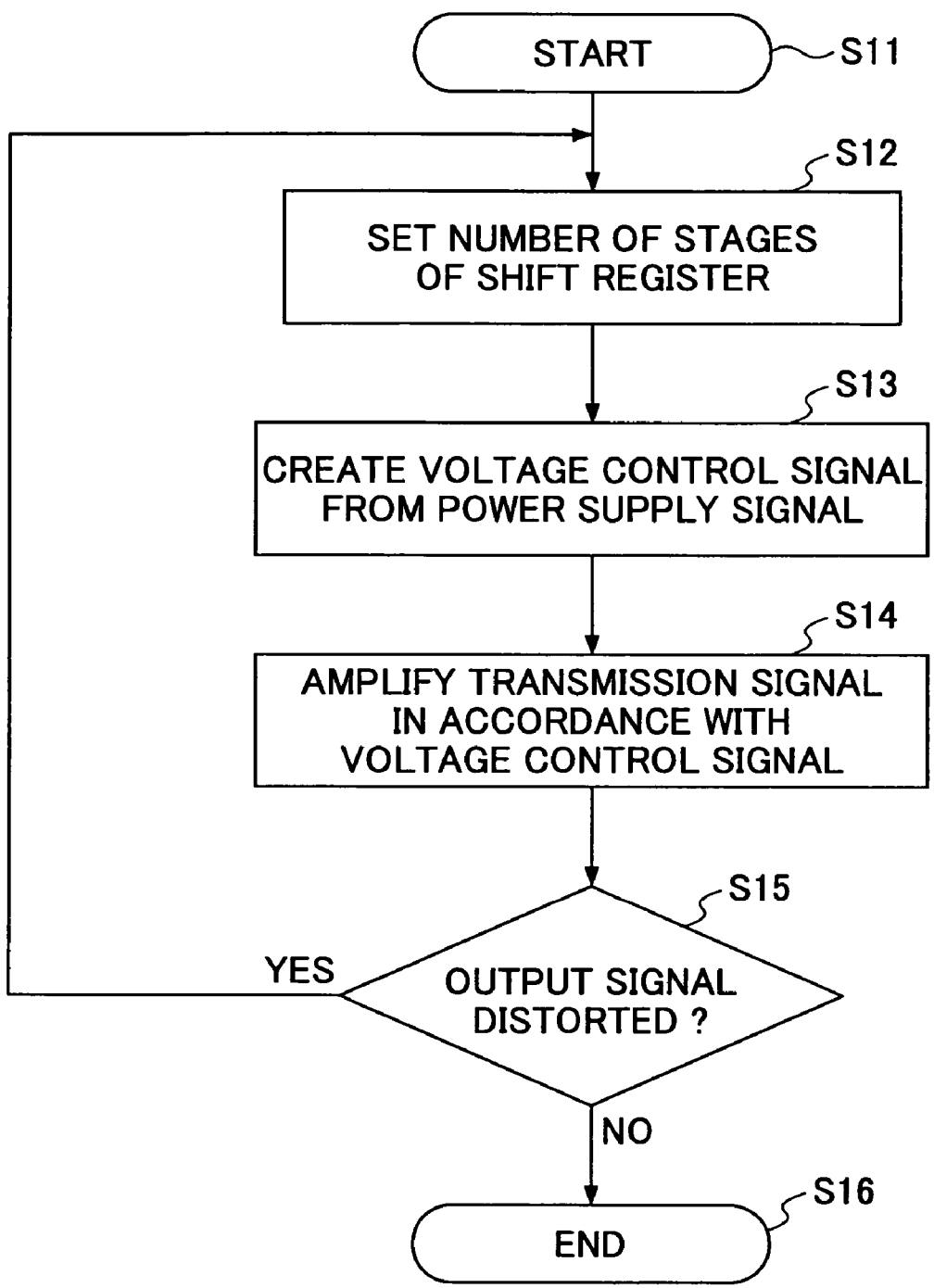
FIG. 10 is a flowchart showing a method of suitably controlling the number of data samples to be stored in a shift register according to the second embodiment of the present invention.

FIG. 10 is a flowchart showing a method of suitably controlling the number of data samples to be stored in the shift register 431. In step S11, the flow starts, and in step S12, the number of stages of the shift register 431 is set to a certain value. The initial value may be one. When the number of stages is one, the power supply signal Tx and the voltage control signal V are equal.

In step S13, the voltage control signal V is created from the output signal of the envelope detector part 42, or the power supply signal Tx, using the above-described method.

In step S14, the transmission signal is amplified in the amplifier 41 in accordance with the voltage control signal V.

In step S15, the output signal of the amplifier 41 is analyzed in the signal analyzer part 44, and it is determined whether the output signal is distorted. Whether the output signal is distorted may be determined using one or more standards such as the presence or absence of an unnecessary wave and degradation of signal quality. The signal analyzer part 44 outputs a control signal based on the analysis to the voltage control signal controller part 43. If the output signal is distorted (YES in step S15), the flow returns to step S12, and the number of stages of the shift register 431 is set to another value. For example, the number of stages may be increased to be odd numbers such as 1, 3, 5, . . . , or be incremented one by one in such a way as 1, 2, 3, . . . . Then, the above-described operation is repeated. If it is determined that the output signal is not distorted (NO in step S15), this means that an appropriate number of stages is set in the shift register 431, and in step S16, the flow ends.

For convenience of description, the number of stages of the shift register 431 is increased from one in the flowchart of FIG. 10. Alternatively, the number of stages of the shift register 431 may be decreased from a large value. In this case, the flow ends when the output signal starts to be distorted in the determination of step S15.

Third Embodiment

According to the second embodiment, the number of stages of the shift register 431 is gradually increased or decreased so that an optimal number of stages can be reached. According to a third embodiment of the present invention, the channel delay between a main signal channel and a control signal channel is measured. The number of data samples to be stored in the voltage control signal controller part 43 is determined so as to compensate for the delay.

Figure 11:
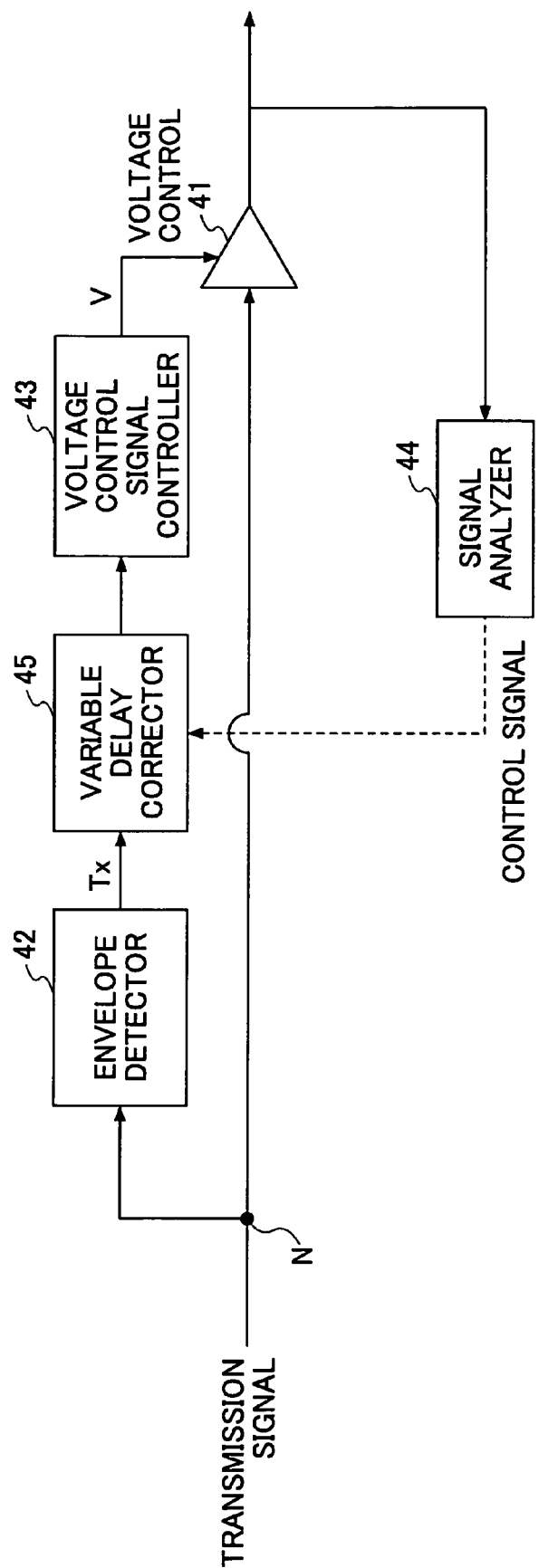
FIG. 11 is a block diagram showing part of a linear transmitter according to a third embodiment of the present invention.

FIG. 11 is a block diagram showing part of a linear transmitter according to the third embodiment. In FIG. 11, the same elements as those described in FIGS. 4 and 9 are referred to by the same numerals, and a redundant description thereof is omitted. Referring to FIG. 11, a variable delay corrector part 45 is provided in addition to the elements described in FIGS. 4 and 9. In accordance with an instruction from the signal analyzer part 44, the variable delay corrector part 45 introduces a delay between the main signal channel from a node N to the amplifier 41 and the control signal channel from the node N to the amplifier 41 via the envelope detector part 42 and the voltage control signal controller part 43. In the graphically illustrated case, the variable delay corrector part 45 is provided so as to delay the control signal channel side. Alternatively, the variable delay corrector part 45 may be provided on the main signal channel side. This is because it is only necessary to introduce a relative delay between the main signal channel and the control signal channel. In terms of improving the capability to swiftly control delay, the variable delay corrector part 45 may be provided in each of the main signal channel and the control signal channel.

Figure 12:
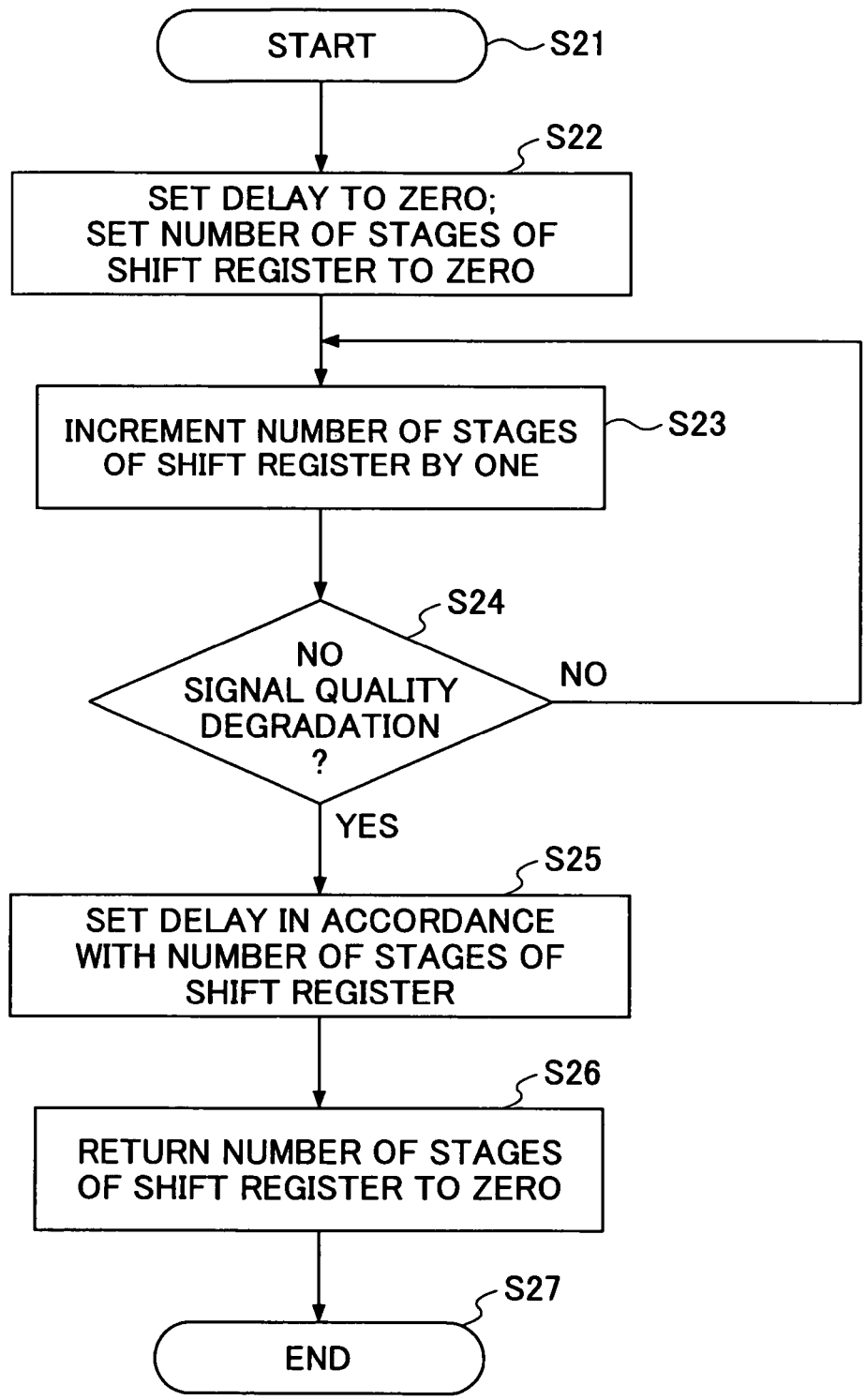
FIG. 12 is a flowchart of a method of correcting the timing of the voltage control signal with a signal delay based on information on the number of data samples to be stored in the shift register according to the third embodiment of the present invention.

FIG. 12 is a flowchart of a method of controlling the timing of the voltage control signal V based on the number of data samples to be stored in the shift register 431. In step S21, the flow starts. In step S22, the delay of the variable delay corrector part 45 is set to zero, and the number of stages of the shift register 431 is set to zero. As a result, the power supply signal Tx and the voltage control signal V are equal.

In step S23, the number of stages of the shift register 431 is incremented by one (+1).

In step S24, the output signal of the amplifier 41 is analyzed in the signal analyzer part 44, and it is determined whether there is no degradation of signal quality. If it is determined that there is degradation of signal quality (NO in step S24), the flow returns to step S23, and the number of stages of the shift register 431 is incremented by one. Steps S23 and S24 are repeated until good signal quality is obtained. Any signal may be employed as a transmission signal used in measuring a channel delay. In terms of improving measurement accuracy, it is preferable to employ a test signal having a special waveform. For example, an impulse signal and a two-tone signal may be used as test signals. However, the test signal is not limited to these, and signals of various waveforms may be used.

If there is no degradation of signal quality (YES in step S24), in step S25, the variable delay of the variable delay corrector part 45 is determined based on the number of stages of the shift register 431. This is because the number of stages of the shift register 431 corresponds to the timing offset of the voltage control signal V.

In step S26, the number of stages of the shift register 431 is returned to zero, and in step S27, the flow ends.

According to one embodiment of the present invention, a power supply signal showing the level of a transmission signal to be transmitted from a linear transmitter is generated. A supply voltage control signal is output based on the power supply signal, and the transmission signal is amplified based on the supply voltage control signal. A series of multiple values of the power supply signal belonging to a time range including a certain point of time are stored, and a maximum one of a predetermined number of values of the multiple values of the power supply signal is output as the supply voltage control signal at the certain point of time. Thereby, the supply voltage control signal is obtained. As a result, even if there is a slight offset between the transmission signal and the power supply signal, it is ensured that the supply voltage control signal is higher than or equal to the transmission signal in level, so that unnecessary radiation and signal degradation are effectively controlled.

The time range may be determined so as to include an odd number of sampling instants with the certain point of time being the center thereof. As a result, even if timing is offset forward or backward from the certain point of time, it is possible to control unnecessary radiation.

The power supply signal may be lower in rate than the transmission signal.

The size of the time range may be controlled in accordance with a feedback signal from an amplification part. As a result, it is possible to cope with timing offset efficiently without excessively reducing amplification efficiency.

The appropriateness of the time range may be determined by measuring the signal quality or unnecessary wave component outside a desired band of the feedback signal from the amplification part.

A part to control the size of the time range in accordance with the feedback signal from the amplification part may be removable from the main body of the transmitter. As a result, it is possible to simplify the main body of the transmitter.

A delay part to change, in accordance with an instruction, the delay between a main signal channel for transmitting the transmission signal and a control signal channel for generating and transmitting the supply voltage control signal may be provided.

According to one embodiment of the present invention, the delay between the main signal channel for transmitting the transmission signal and the control signal channel for generating and transmitting the supply voltage control signal is changed in accordance with an instruction, and the signal quality of the feedback signal from the amplification part is measured. The delay is determined based on the time range causing a change in the signal quality of the feedback signal from the amplification part, and thereafter, the time range is set to zero. As a result, it is possible to set the delay with simplicity and efficiency.

A test signal having a known waveform may be used as the transmission signal. This makes it possible to improve the accuracy of delay measurement.

According to one embodiment of the present invention, in a transmitter switching the power supply level of an amplifier for a linear transmitter in accordance with the level of a transmission signal, a supply voltage control signal is created so that an output signal including little distortion can be output with high amplification efficiency even if there is timing offset between the transmission signal input to the amplifier and a power supply signal.

The present invention is not limited to the specifically disclosed embodiments, and variations and modifications may be made without departing from the scope of the present invention.

The present application is based on Japanese Priority Patent Application No. 2005-370647, filed on Dec. 22, 2005, the entire contents of which are hereby incorporated by reference.

What is claimed is:

1. A device comprising:
   an amplification part for a linear transmitter, the amplification part being configured to amplify a transmission signal in accordance with a supply voltage control signal;
   a generation part configured to generate a power supply signal showing a level of the transmission signal; and
   a control part configured to output the supply voltage control signal based on the power supply signal,
   wherein the control part includes:
      a storage part configured to store a series of values of the power supply signal belonging to a time range including a certain point of time; and
      an output part configured to output a maximum one of a predetermined number of values of said series of values of the power supply signal as the supply voltage control signal at the certain point of time.

2. The device as claimed in claim 1, wherein the power supply signal is lower in rate than the transmission signal.

3. The device as claimed in claim 1, further comprising:
   a compensation range control part configured to control size of the time range in accordance with a feedback signal from the amplification part.

4. The device as claimed in claim 3, wherein the compensation range control part includes a part configured to measure signal quality of the feedback signal.

5. The device as claimed in claim 4, wherein the compensation range control part includes a part configured to measure an unnecessary wave component outside a desired band of the feedback signal.

6. The device as claimed in claim 3, wherein the compensation range control part is detachable from the device.

7. The device as claimed in claim 3, further comprising:
   a delay part configured to change, in accordance with an instruction, a delay between a main signal channel for transmitting the transmission signal and a control signal channel for generating and transmitting the supply voltage control signal.

8. A mobile communications device comprising:
   the device as set forth in claim 1.

9. A method comprising the steps of:
   (a) generating a power supply signal showing a level of a transmission signal to be transmitted from a linear transmitter;
   (b) outputting a supply voltage control signal based on the power supply signal; and
   (c) amplifying the transmission signal in accordance with the supply voltage control signal,
   wherein said step (b) includes the steps of:
      (d) storing a series of values of the power supply signal belonging to a time range including a certain point of time; and
      (e) outputting a maximum one of a predetermined number of values of said series of values of the power supply signal as the supply voltage control signal at the certain point of time.

10. The method as claimed in claim 9, further comprising the steps of:
- (f) changing a main signal channel for transmitting the transmission signal and the time range; and
- (g) measuring signal quality of a feedback signal from said step (c), wherein a delay of the supply voltage control signal is determined based on the time range causing a change in the signal quality of the feedback signal, and the time range is set to zero after the determination.

11. The method as claimed in claim 10, wherein a test signal having a known waveform is used as the transmission signal.

* * * * *